United States Patent [19]

Ishida et al.

[11] Patent Number: 4,883,766
[45] Date of Patent: Nov. 28, 1989

[54] METHOD OF PRODUCING THIN FILM TRANSISTOR

[75] Inventors: Mamoru Ishida, Yokohama; Shunichi Inaki, Toyonaka; Yoshikazu Akiyama; Mitsuhiro Kohata, both of Yokohama, all of Japan

[73] Assignees: Ricoh Company, Ltd., Tokyo; Ricoh Research Institute of General Electronics, Natori, both of Japan

[21] Appl. No.: 269,452

[22] Filed: Nov. 10, 1988

[30] Foreign Application Priority Data

Nov. 14, 1987 [JP] Japan ............................. 62-288193

[51] Int. Cl.$^4$ .................. H01L 29/78; H01L 27/12
[52] U.S. Cl. .................................. 437/40; 437/937; 437/941
[58] Field of Search ............. 437/40, 41, 937, 941; 357/23.7

[56] References Cited

U.S. PATENT DOCUMENTS

| 3,849,204 | 11/1974 | Fowler | 437/941 |
| 3,852,120 | 12/1974 | Johnson et al. | 437/941 |
| 3,923,559 | 12/1975 | Sinha | 437/941 |

FOREIGN PATENT DOCUMENTS

| 0027575 | 2/1984 | Japan | 437/937 |
| 0000165 | 1/1988 | Japan | 437/41 |
| 1214686 | 12/1970 | United Kingdom | 437/937 |
| 2056174 | 3/1981 | United Kingdom | 437/941 |

Primary Examiner—Brian E. Hearn
Assistant Examiner—Tuan Nguyen
Attorney, Agent, or Firm—Oblon, Spivak, McClelland, Maier & Neustadt

[57] ABSTRACT

A method of producing a thin film transistor comprises the steps of preparing a structure having a substrate, an active layer and a diffusion layer formed on the substrate, and a gate electrode formed on the active layer, forming on the structure an interlayer insulator layer made of a silicon oxide hydrate ($SiO_xH_y$) having a predetermined composition, forming contact holes in the interlayer insulator layer, forming a wiring layer on the interlayer insulator layer, and carrying out a thermal process thereby diffusing hydrogen atoms within the interlayer insulator layer into at least the active layer and the diffusion layer.

20 Claims, 2 Drawing Sheets

METHOD OF PRODUCING THIN FILM TRANSISTOR

BACKGROUND OF THE INVENTION

The present invention generally relates to methods of producing thin film transistors, and more particularly to a method of producing a thin film transistor wherein a predetermined process is carried out during a production process using polysilicon so as to improve the thin film transistor characteristic.

Recently, there is active development in thin film transistors which are used for driving an image sensor, a liquid crystal display and the like. In addition to improving the thin film transistor characteristic, it is expected that the thin film transistor is applied to various technical fields.

In a metal oxide semiconductor (MOS) thin film transistor which uses polysilicon, a trap state exists at a polysilicon grain boundary due to a dangling bond and a trapping of carriers occurs. Hence, a barrier potential is formed along the grain boundary and a carrier mobility decreases, thereby suffering a problem in that an ON current is small.

As a measure against the above problem, hydrogen atoms are usually introduced to the polysilicon grain boundary so as to correct the disturbance of the crystal lattice. The density of the dangling bond is reduced to reduce the trap state, and the height of the barrier potential is reduced to improve the carrier mobility. For example, the hydrogen atoms are conventionally introduced to the polysilicon grain boundary as described hereunder.

In FIG. 1A, a thin film transistor has an insulator sustrate 1 made of silicon (Si) or the like, a polysilicon active layer 2, a polysilicon diffusion layer 3, a gate oxide layer 4 made of silicon dioxide ($SiO_2$) or the like, a gate electrode 5, an interlayer insulator layer 6, a wiring layer 7 made of aluminum (Al) or the like, and a passivation layer 8. After this thin film transistor is formed, hydrogen atoms are introduced to the active layer 2 and the diffusion layer 3 by use of a radio frequency (RF) hydrogen discharge plasma chemical vapor deposition (CVD).

In FIG. 1B, those parts which are essentially the same as those corresponding parts in FIG. 1A are designated by the same reference numerals. In this case, after the thin film transistor is formed, hydrogen ions are implanted to the active layer 2 and the diffusion layer 3 followed by an activation at approximately 400° C.

In FIG. 1C, those parts which are essentially the same as those corresponding parts in FIG. 1A are designated by the same reference numerals. In this case, after the thin film transistor is formed, a passivation $SiN_xH_y$ layer is formed and hydrogen atoms are introduced to the active layer 2 and the diffusion layer 3 by a thermal diffusion.

However, the methods described in conjunction with FIGS. 1A through 1C all introduce the hydrogen atoms to the active layer 2 and the diffusion layer 3 in a final process after the thin film transistor is formed. In other words, a process is required in addition to the processes of forming the thin film transistor, and an increase in the number of production steps is unavoidable.

In addition, as may be seen from FIGS. 1A through 1C, the gate oxide layer 4, the gate electrode 5 and the interlayer insulator layer 6 are stacked at the active layer 2 and the diffusion layer 3 where the hydrogen atoms are to be introduced. For this reason, an appropriate process conditions must be satisfied in order that the hydrogen atoms reach the active layer 2 and the diffusion layer 3. That is, a high output is required of the RF hydrogen discharge plasma CVD in the case shown in FIG. 1A, a high implantation energy and high temperature for the activation are required in the case shown in FIG. 1B, and a high hydrogen density within the passivation $SiN_xH_y$ layer and a high temperature for the thermal diffusion are required in the case shown in FIG. 1C. However, these process conditions must be set under a restriction that no damage is made to the thin film transistor. Therefore, the conventional methods of forming the thin film transistors are not efficient from this point of view.

SUMMARY OF THE INVENTION

Accordingly, it is a general object of the present invention to provide a novel and useful method of producing a thin film transistor in which the problems described above are eliminated.

Another and more specific object of the present invention is to provide a method of producing a thin film transistor wherein hydrogen atoms are introduced to a polysilicon active layer and a polysilicon diffusion layer with a high efficiency. According to the method of the present invention, it is possible to form a thin film transistor having an extremely satisfactory thin film transistor characteristic.

Still another object of the present invention is to provide a method of producing a thin film transistor wherein hydrogen atoms are introduced to a polysilicon active layer, and a polysilicon diffusion layer and a gate electrode with a high efficiency. According to the method of the present invention, it is possible to reduce the resistance of the gate electrode.

A further object of the present invention is to provide a method of producing a thin film transistor comprising the steps of preparing a structure having a substrate, an active layer and a diffusion layer formed on the substrate, and a gate electrode formed on the active layer, forming on the structure an interlayer insulator layer made of a silicon oxide hydrate ($SiO_xH_y$) having a predetermined composition, forming contact holes in the interlayer insulator layer, forming a wiring layer on the interlayer insulator layer, and carrying out a thermal process thereby diffusing hydrogen atoms within the interlayer insulator layer into at least the active layer and the diffusion layer. According to the method of the present invention, it is possible to produce a thin film transistor having an extremely satisfactory thin film transistor characteristic. In a case where a sintering process is carried out with respect to the wiring layer, there is no need to provide a step exclusively for diffusing the hydrogen atoms into the active layer and the diffusion layer.

Other objects and further features of the present invention will be apparent from the following detailed description when read in conjunction with the accompanying drawings.

DETAILED DESCRIPTION

The present inventors have confirmed through experiments that when an interlayer insulator layer is formed by use of a silicon oxide hydrate (SiO$_x$H$_y$) having a predetermined composition and a sintering process is carried out later with respect to an aluminum (Al) wiring layer during a production process of a thin film transistor, hydrogen atoms within the SiO$_x$H$_y$ are effectively introduced to a polysilicon active layer and a polysilicon diffusion layer due to the heat generated during the sintering process. In addition, the present inventors have also confirmed that the resistance of a gate electrode is reduced by the introduction of the hydrogen atoms thereto and the state of the interlayer insulator layer is satisfactory.

Figure 2A:
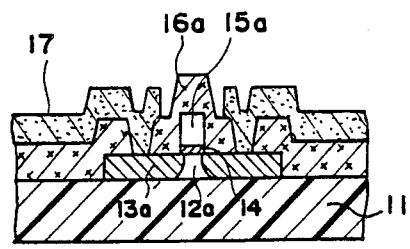
FIG. 2A is a cross sectional view generally shows a production process of a MOS thin film transistor using polysilicon in a state before a sintering process is carried out for explaining an embodiment of the method of producing a thin film transistor according to the present invention.

FIG. 2A generally shows a production process of a MOS thin film transistor using polysilicon in a state before a sintering process is carried out for explaining an embodiment of the method of producing a thin film transistor according to the present invention. A thin film transistor has an insulator sustrate 11 made of silicon (Si) or the like, a polysilicon active layer 12a to which the hydrogen atoms have not yet been introduced, a polysilicon diffusion layer 13a to which the hydrogen atoms have not yet been introduced, a gate oxide layer 14 made of silicon dioxide (SiO$_2$) or the like, a gate electrode 15a the resistance of which has not yet been reduced, an SiO$_x$H$_y$ layer 16a which later becomes an interlayer insulator layer 16, and a wiring layer 17 made of aluminum (Al) or the like.

Figure 1A:
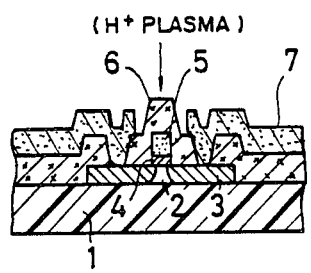
FIGS. 1A through 1C are cross sectional views respectively showing thin film transistors for explaining examples of conventional methods of introducing hydrogen atoms to an active layer and a diffusion layer.
Figure 1B:
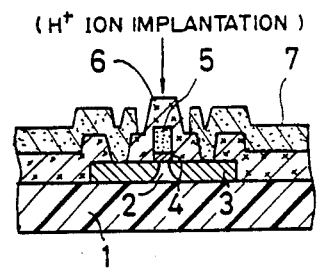
Figure 1C:
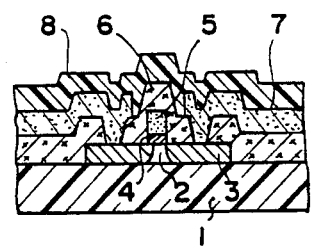

Except for the fact that the layer 16a which later becomes the interlayer insulator layer 16 is made of SiO$_x$H$_y$ and that the hydrogen atoms have not yet been introduced to the active layer 12a and the diffusion layer 13a, the structure of the MOS thin film transistor shown in FIG. 2A is basically the same as the conventional MOS thin film transistor shown in FIGS. 1A through 1C. Accordingly, the MOS thin film transistor shown in FIG. 2A can be used by use of known production processes of the thin film transistor.

For example, a polysilicon layer (semiconductor layer) is formed to a thickness of approximately 1700 Å on the Si substrate 11 by a low pressure CVD at 625° C., 0.15 Torr and SiH$_4$/N$_2$=30/100 SCCM. Then, a silicon oxide layer of approximately 1300 Å is formed by a dry oxidation at 1025° C. and O$_2$+HCl(1%)=5 l/min. Further, a polysilicon layer of approximately 4000 Å is formed by a low pressure CVD at 625° C., 0.2 Torr and SiH$_4$=150 SCCM. Next, the SiO$_2$ gate oxide layer 14a and the gate electrode 15a are formed by a photolithography etching. For example, a BSG coating type diffusion agent (for example, B-59220 manufactured by Tokyo Ouka of Japan) is coated in the case of a p-channel thin film transistor, and a PSG coating type diffusion agent (for example, B-59250 manufactured by Tokyo Ouka of Japan) is coated in the case of an n-channel thin film transistor. The impurities are diffused for approximately 30 minutes at 900° C. in an inert gas which is preferably N$_2$ gas. As a result, the active layer 12a and the diffusion layer 13a are formed to which the hydrogen atoms have not yet been introduced.

In this embodiment, the SiO$_x$H$_y$ layer 16a is once formed to a thickness of approximately 50 Å to 1.5 microns, and desirably in a range of 4000 Å to 10,000 Å. It is desirable that $x=2-a$, $y=2a$ and $x+y=2$ in the SiO$_x$H$_y$ layer 16a, where a is 0.5 to 0.01 and desirably in a range of 0.3 to 0.05. The SiO$_x$H$_y$ layer 16a may be formed by a plasma CVD, electron cyclotron resonance (ECR) plasma CVD and the like. It is possible to control the content of hydrogen to $10^{-3}$ to 20 atomic percent depending on the condition under which the SiO$_x$H$_y$ layer 16a is formed.

Contact holes are formed after the formation of the SiO$_x$H$_y$ layer 16a, and the Al wiring layer 17 is formed to a thickness of approximately 1 micron by a vacuum evaporation at a vacuum of $5 \times 10^{-6}$ Torr. Then, an electrode patterning is carried out to obtain the structure shown in FIG. 2A.

Figure 2B:
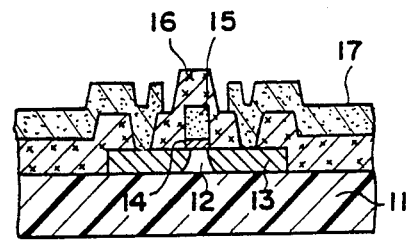
FIG. 2B is a cross sectional view generally showing the MOS thin film transistor produced by the embodiment of the method.

In this embodiment, a thermal process is carried out after the electrode patterning so as to introduce (diffuse) the hydrogen atoms within the SiO$_x$H$_y$ layer 16a to the active layer 12a and the diffusion layer 13a. As a result, a MOS thin film transistor shown in FIG. 2B is produced. A portion of the SiO$_x$H$_y$ layer 16a from which the hydrogen atoms have escaped is extremely close in structure to SiO$_2$ and constitutes an interlayer insulator layer 16. In addition, the active layer 12a and the diffusion layer 13a introduced with the hydrogen atoms respectively become an active layer 12 and a diffusion layer 13 which are basically the same as the corresponding active layer 2 and the diffusion layer 3 of the conventional thin film transistor shown in FIGS. 1A through 1C. Furthermore, the gate electrode 15a becomes a gate electrode 15 having a reduced resistance because the hydrogen atoms within the SiO$_x$H$_y$ layer 16a also diffuse into the gate electrode 15a.

It is not essential that the thermal process is carried out exclusively for diffusing the hydrogen atoms within the SiO$_x$H$_y$ layer 16a to the active layer 12a and the diffusion layer 13a. In this embodiment, this diffusion of the hydrogen atoms into the active layer 12a and the diffusion layer 13a is carried out by the heat generated during a sintering process (thermal process) which is carried out with respect to the Al wiring layer 17. For example, the sintering process is carried out in an inert gas which is desirably N$_2$ gas at 350° C. to 500° C. for 20 minutes to 60 minutes. Desirably, the sintering process is carried out at 400° C. to 450° C. Hence, it is possible to positively prevent damage to the thin film transistor by the process carried out to diffuse the hydrogen atoms into the active layer 12a and the diffusion layer 13a.

The MOS thin film transistor shown in FIG. 2B produced by this embodiment has an extremely satisfactory thin film transistor characteristic, and the thin film transistor characteristic can be maintained for a long period of time.

Figure 3:
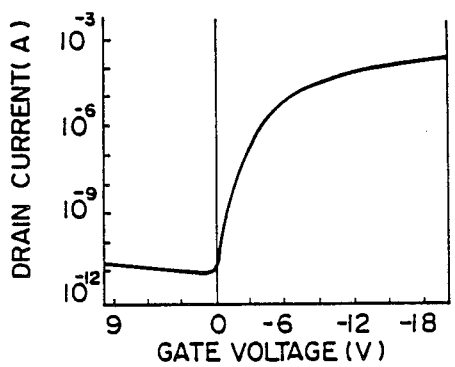
FIG. 3 shows a static characteristic of a p-channel MOS thin film transistor produced by the embodiment of the method according to the present invention.

FIG. 3 shows a static characteristic of a p-channel MOS thin film transistor produced by the embodiment of the method according to the present invention. A notable increase in the ON current of the thin film transistor may be seen from FIG. 3.

Figure 4:
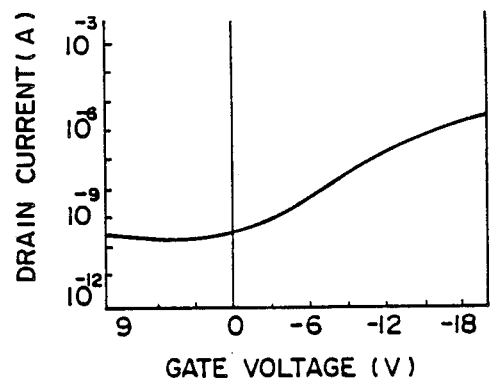
FIG. 4 shows a static characteristic of a p-channel MOS thin film transistor having an SiO$_2$ interlayer insulator layer and no hydrogen atoms are introduced to an active layer and a diffusion layer.

For comparison purposes, FIG. 4 shows a static characteristic of a p-channel MOS thin film transistor in which an SiO$_2$ interlayer insulator layer having a thickness of approximately 6000 Å is formed by a low pressure CVD at 410° C., 0.2 Torr, SiH$_4$=20 SCCM and O$_2$=100 SCCM, and no hydrogen atoms are introduced to an active layer and a diffusion layer. It is evident by comparing FIGS. 3 and 4 that the method of the present invention enables production of a thin film transistor having an extremely satisfactory thin film transistor characteristic.

Further, the present invention is not limited to these embodiments, but various variations and modifications may be made without departing from the scope of the present invention.

What is claimed is:

1. A method of producing a thin film transistor comprising the steps of:
    preparing a structure having a substrate, an active layer and a diffusion layer formed on the substrate, and a gate electrode formed on the active layer;
    forming on said structure an interlayer insulator layer made of a silicon oxide hydrate (SiO$_x$H$_y$) having a predetermined composition;
    forming contact holes in said interlayer insulator layer;
    forming a wiring layer on said interlayer insulator layer; and
    carrying out a thermal process thereby diffusing hydrogen atoms within said interlayer insulator layer into at least said active layer and said diffusion layer.

2. A method of producing a thin film transistor as claimed in claim 1 in which said step of forming the interlayer insulator layer uses an SiO$_x$H$_y$, where $x=2-a$, $y=2a$ and a is greater than or equal to 0.01.

3. A method of producing a thin film transistor as claimed in claim 1 in which said step of forming the interlayer insulator layer uses an SiO$_x$H$_y$ having a hydrogen content of $10^{-3}$ to 20 atomic percent.

4. A method of producing a thin film transistor as claimed in claim 3 in which said step of forming the interlayer insulator layer forms said interlayer insulator layer to a thickness of approximately 50 Å to 1.5 microns.

5. A method of producing a thin film transistor as claimed in claim 1 in which said step of forming the interlayer insulator layer forms said interlayer insulator layer by a plasma chemical vapor deposition.

6. A method of producing a thin film transistor as claimed in claim 1 in which said step of forming the structure forms said active layer and said diffusion layer from polysilicon.

7. A method of producing a thin film transistor as claimed in claim 1 in which said step of carrying out the thermal process further diffuses the hydrogen atoms within said interlayer insulator layer into said gate electrode, thereby reducing a resistivity of said gate electrode.

8. A method of producing a thin film transistor as claimed in claim 1 in which said step of forming the wiring layer forms an aluminum (Al) layer as said wiring layer.

9. A method of producing a thin film transistor as claimed in claim 8 in which said step of carrying out the thermal process is a sintering process carried out with respect to said Al layer.

10. A method of producing a thin film transistor as claimed in claim 9 in which said sintering process is carried out in an inert gas gas at 350° C. to 500° C. for 20 minutes to 60 minutes.

11. A method of producing a thin film transistor comprising the steps of:
    preparing a structure having a substrate, an active layer and a diffusion layer formed on the substrate, and a gate electrode formed on the active layer;
    forming on said structure an interlayer insulator layer made of a silicon oxide hydrate (SiO$_x$H$_y$) having a predetermined composition;
    forming contact holes in said interlayer insulator layer;
    forming a wiring layer on said interlayer insulator layer;
    patterning said wiring layer; and
    carrying out a thermal process thereby diffusing hydrogen atoms within said interlayer insulator layer into at least said active layer and said diffusion layer.

12. A method of producing a thin film transistor as claimed in claim 11 in which said step of forming the interlayer insulator layer uses an SiO$_x$H$_y$, where $x=2-a$, $y=2a$ and a is greater than or equal to 0.01.

13. A method of producing a thin film transistor as claimed in claim 11 in which said step of forming the interlayer insulator layer uses an SiO$_x$H$_y$ having a hydrogen content of $10^{-3}$ to 20 atomic percent.

14. A method of producing a thin film transistor as claimed in claim 13 in which said step of forming the interlayer insulator layer forms said interlayer insulator layer to a thickness of approximately 50 Å to 1.5 microns.

15. A method of producing a thin film transistor as claimed in claim 11 in which said step of forming the interlayer insulator layer forms said interlayer insulator layer by a plasma chemical vapor deposition.

16. A method of producing a thin film transistor as claimed in claim 11 in which said step of forming the structure forms said active layer and said diffusion layer from polysilicon.

17. A method of producing a thin film transistor as claimed in claim 11 in which said step of carrying out the thermal process further diffuses the hydrogen atoms within said interlayer insulator layer into said gate electrode, thereby reducing a resistivity of said gate electrode.

18. A method of producing a thin film transistor as claimed in claim 11 in which said step of forming the wiring layer forms an aluminum (Al) layer as said wiring layer.

19. A method of producing a thin film transistor as claimed in claim 18 in which said step of carrying out the thermal process is a sintering process carried out with respect to said Al layer.

20. A method of producing a thin film transistor as claimed in claim 19 in which said sintering process is carried out in an inert gas gas at 350° C. to 500° C. for 20 minutes to 60 minutes.

* * * * *